United States Patent [19]

Mu

[11] Patent Number: 4,887,148
[45] Date of Patent: Dec. 12, 1989

[54] PIN GRID ARRAY PACKAGE STRUCTURE

[75] Inventor: Albert T. Mu, San Jose, Calif.

[73] Assignee: Advanced Micro Devices, Inc., Sunnyvale, Calif.

[21] Appl. No.: 219,149

[22] Filed: Jul. 15, 1988

[51] Int. Cl.$^4$ ............................................. H01L 23/02
[52] U.S. Cl. .......................................... 357/74; 357/72
[58] Field of Search ............................. 357/74, 70, 72

[56] References Cited

U.S. PATENT DOCUMENTS

| 4,812,897 | 3/1989 | Narita et al. | 357/74 |
| 4,823,234 | 4/1989 | Konishi et al. | 357/72 |

*Primary Examiner*—James W. Davie
*Attorney, Agent, or Firm*—Davis Chin

[57] ABSTRACT

A pin grid array package structure includes a package body member (12), a wiring board (14) having a central portion for receiving a semiconductor chip (18), a tape lead circuit (16), and a cover member (22). A plurality of metal terminal pins (24) extend substantially over the entire top and bottom surfaces of the body member (12). The terminal pins extend from a bottom surface of the body member (12) and protrude slightly above a top surface thereof to form terminal pin ends (30). The wiring board (14) is placed over the body member (12) for engagement with the terminal pin ends (30). The wiring board (14) has a metalized trace pattern deposited on its top surface. The wiring board further includes an outer lead bonding area (34a) of a rectangular shape which is disposed in spaced apart surrounding relationship with the chip (18). The outer lead bonding area (34a) is formed with bonding pads (42a). The metalized trace pattern includes a plurality of conductor runs (40) terminating at its outer ends with spaced apart metal terminal pads (36) which are in substantially vertical alignment with the respective terminal pin ends (30). The plurality of conductor runs (40) are formed of first conductor runs (40a) extending outwardly from the bonding pads (42a) on the outer lead bond area (34a) and alternating second conductor runs (40a) extending inwardly from the bonding pads (42a) on the outer lead bond area (34a). The cover member encloses the body member, tape circuit, die and wiring board to prevent exposure to atmospheric environment.

16 Claims, 3 Drawing Sheets

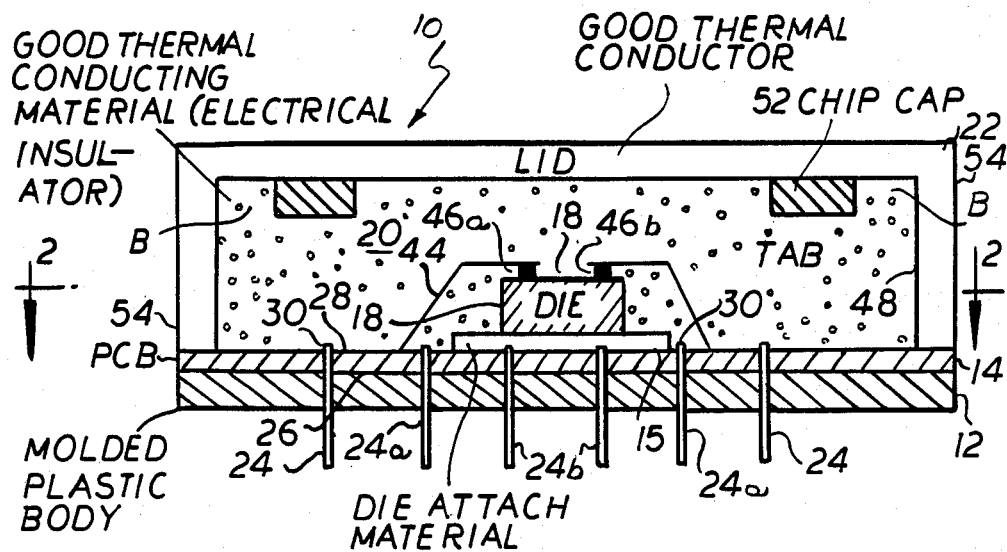
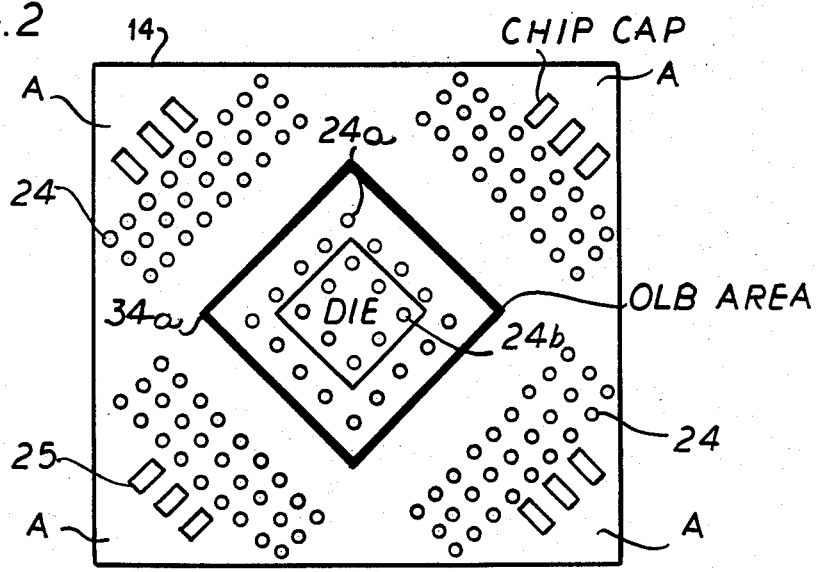
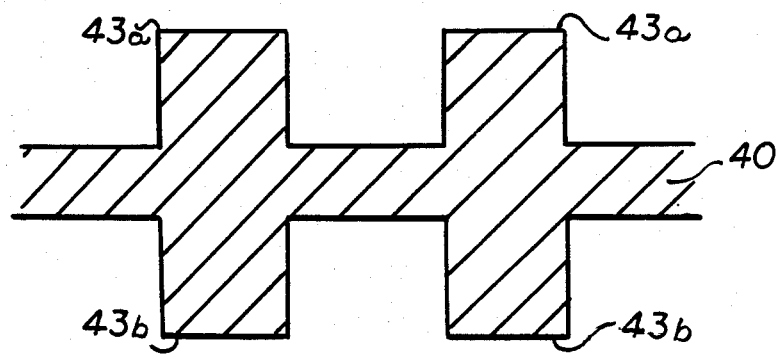

PIN GRID ARRAY PACKAGE STRUCTURE

DESCRIPTION

BACKGROUND OF THE INVENTION

This invention relates generally to semiconductor integrated circuit packaging and more particularly, it relates to a pin grid array package structure which has a higher packaging density, equalized signal delays and minimum cross-talk.

Due to the increasing commercial need of semiconductor integrated circuits which can perform more and more functions, semiconductor integrated circuit chips are becoming very large in size and dissipate large amounts of power. With the increased size and power requirements, there has also been an increase in the complexity and cost of providing interconnections and packaging for the semiconductor chips. In order to reduce cost and increase reliability, some interconnection designs of the prior art have provided insulator substrate such as ceramic or wiring boards on which are mounted the semiconductor chips or dies.

The metal conductors or traces on the wiring boards are generally used to interconnect bonding pads on an outer lead bonding area surrounding the die to the plurality of terminal pins. The traces in the prior art design are typically routed away from the outer lead bond area towards the outside edges of the package with either very long or very short interconnection traces to the various external pins. In other prior art designs, the traces are routed away from the outer lead bond area towards the die again with either very long or very short interconnection traces to the various external terminal pins. As a result, the very long trace lengths had an increased parasitic inductance and capacitance over the very short trace lengths. Further, this would create the problem of an electrical signal delay between the different traces or signal channels.

It would therefore be desirable to provide a pin grid array package structure which has a higher packaging density than those traditionally available. Further, it would be expedient to reduce the physical length of the very long traces so that the difference in lengths of all of the traces are less than the conventional pin grid array structures, thereby equalizing the electrical signal delay between different channels. This is accomplished in the present invention by the provision of a substrate or wiring board having a plurality of conductor runs in which first conductor runs extends outwardly from the bonding pads on the outer lead bond area and alternating second conductor runs extend inwardly from the bonding pads on the outer lead bond area. In addition, delay line (capacitance-loading) networks are formed in the conductor runs for further equalizing signal delay between the different conductor runs.

SUMMARY OF THE INVENTION

Accordingly, it is a general object of the present invention to provide a pin grid array package structure which has a higher packaging density than those traditionally available.

It is an object of the present invention to provide a pin grid array package structure which has a wiring board having a plurality of conductor runs in which first conductor runs extend outwardly from the bonding pads on the outer lead bond area and alternating second conductor runs extend inwardly from the bonding pads on the outer lead area.

It is still another object of the present invention to provide a pin grid array package structure which has a wiring board in which the physical lengths of all of the traces are substantially equal for equalization of signal delays.

It is still yet another object of the present invention to provide a pin grid array package structure in which delay line (capacitance-loading) networks are formed in the metalized trace pattern of a wiring board for equalizing signal delay between different conductor runs thereof.

In accordance with these aims and objectives, the present invention is concerned with the provision of a pin grid array package structure which includes a package body member, a wiring board having a central portion for receiving a semiconductor chip, a TAB tape lead circuit, an insulator material, and a cover member. The package body member is formed of a generally diamond-shaped configuration and has top and bottom surfaces. A plurality of metal terminal pins extends substantially over the entire top and bottom surfaces of the body member. The terminal pins extend from the bottom surface of the body member and protrude slightly above the top surface thereof to form terminal pin ends. The wiring board is placed over the body member for engagement with the terminal pin ends. The wiring board has a metalized trace pattern deposited on its top surface.

The wiring board also includes an outer lead bond area of a rectangular shape which is disposed in a spaced apart surrounding relationship with the chip. The outer lead bond area is formed with bonding pads. The metalized trace pattern includes a plurality of conductor runs terminating at its outer ends with spaced apart metal terminal pads which are in substantially vertical alignment with the corresponding terminal pin ends. The plurality of conductor runs is formed of first conductor runs extending outwardly from the bonding pads on the outer lead bond area and alternating second conductor runs extending inwardly from the bonding pads on the outer lead bond area. The cover member is used to enclose the body member, tape circuit, die and wiring board to prevent exposure to atmospheric environment and to provide good heat-conducting paths for the purpose of thermal dissipation.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a cross-sectional view of a pin grid array package structure of the present invention;

FIG. 2 is a top plan view of the pin grid array package structure of FIG. 1, taken along the lines 2—2, with the tape lead circuit, die and die attach material being omitted for clarity;

FIG. 4 is a top plan view of a portion of a conductor run incorporating a delay line (capacitance-loading) network.

DESCRIPTION OF THE PREFERRED EMBODIMENT

Figure 3:
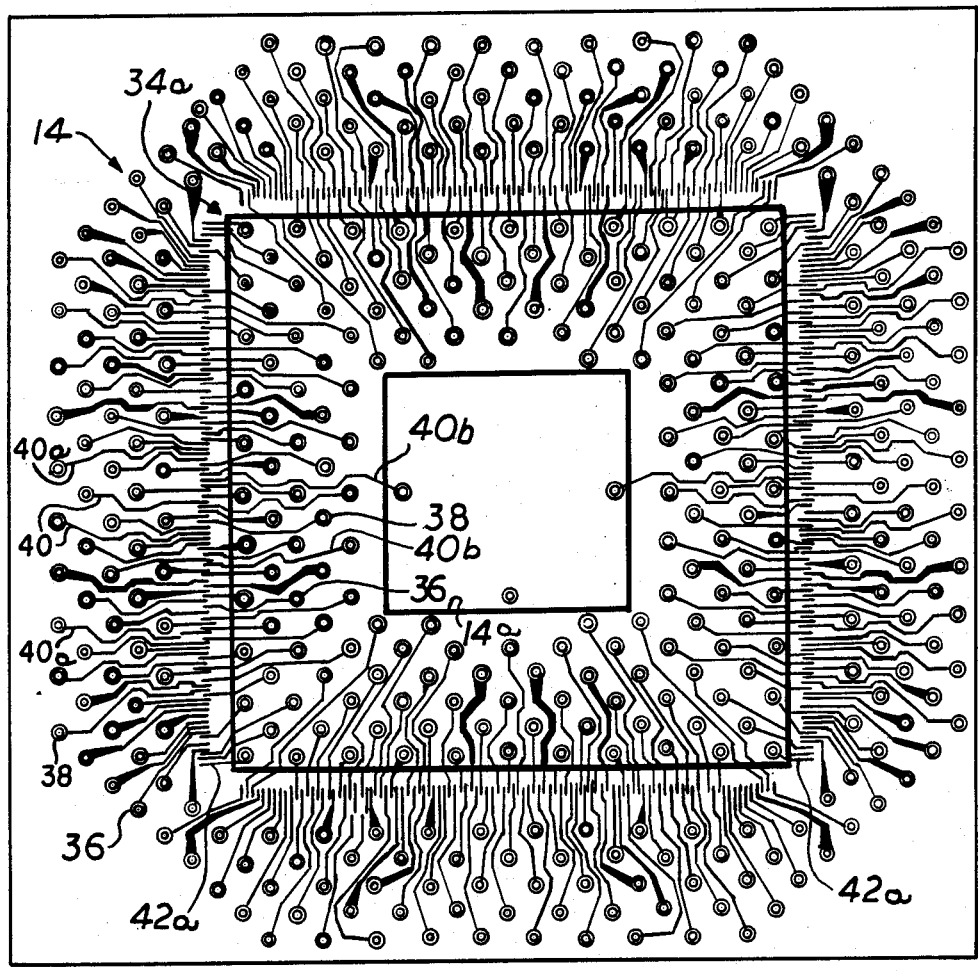
FIG. 3 is a top plan view of the wiring board, showing the outward and inward conductor runs thereof.

Referring now in detail to the various view of the drawings, there is shown in FIG. 1 a pin grid array (PGA) package structure 10 of the present invention. The PGA package structure 10 is comprised of a base unit 12, a substrate 14, a tape automated bonding (TAB) tape lead circuit 16, a semiconductor integrated circuit chip or die 18, insulator material 20, and a cover or lid member 22.

The base unit 12 defines a package body member having a generally diamond-shaped configuration and is preferably formed of a thermoplastic material to incorporate a plurality of metal terminal pins 24 when molded, such as with conventional injection molding equipment. The terminal pins 24 extend from the bottom surface of the body member 12 and protrude slightly above the top surface 28 thereof to form terminal pin ends or posts 30. The four sides of the body member 12 vary in dimension depending upon the number of terminal pins 24 which could be in the range of 68 to 410 pins.

In accordance with the invention, the packaging density of the present PGA package structure 10 is made to be higher than the conventional PGA packages. This is accomplished by the provision of terminal pins extending substantially over the entire top and bottom surfaces of the body member. As can best be seen from FIG. 2, the plurality of terminal pins 24 are disposed within the diamond-shaped body member 12 in the form of rows and columns so as to provide a matrix array. The matrix array is rotated approximately 45° with respect to the four sides of the body member 12. As a result, the body member 12 is formed with four corner areas A. These areas can be effectively used to accommodate discrete capacitors 25 of a decoupling capacitor network, which would otherwise be normally formed on the substrate 14. It will be noted that certain ones of the terminal pins, such as terminal pins 24a, are disposed inside the outer lead bond (OLB) area 34a which is part of the substrate 14. Further, a certain number of other terminal pins 24b are disposed underneath the area of the die 18. As a result, there has been increased the packaging density.

The substrate 14 is shaped in conformity so as to fit over the terminal pin ends 30 protruding slightly above the top surface 28 of the package body member 12 and within the four corner areas A. The substrate 14 is comprised of a wiring board having a metalized trace pattern deposited on its top surface. The outer ends of the metalized trace pattern terminate at spaced apart metalized terminal pads 36. The terminal pad pattern of the wiring board can best be seen from FIG. 3 of the drawings. Each of the terminal pads 36 are disposed so as to be in substantially vertical alignment or registration with the corresponding terminal pin ends 30 protruding slightly from the body member 12. The wiring board 14 further includes a plurality of through-hole openings 38 extending between its top and bottom surfaces and are surrounded by the corresponding terminal pads 36 provided in the metalized trace pattern. These through-hole openings 38 permit a permanent mechanical joinder between the individual terminal pads 36 and the slightly protruding terminal pin ends 38 extending through the openings 38 to be effected by a number of conventional metallurgical bonding procedures such as laser welding, ultrasonic welding, or the like on automatic equipment.

The metalized trace pattern includes a plurality of copper conductor runs or leads 40 extending between bonding pads 42a formed on the outer lead bond area 34a and the terminal pads 36. It will be noted that the metalized trace pattern has a number of conductor runs 40a which extend outwardly from the OLB area 34a towards the outside edges of the package structure and an alternating number of conductor runs 40b which extend inwardly from the OLB area 34a towards the die 18. It should be further noted that some of the conductor runs 40b actually extend underneath the area of the die 18. Therefore, the packaging density has been increased.

Due to the alternating pattern of the conductor runs away from the OLB area 34a, the physical lengths thereof are made shorter, and there has been eliminated the very long and very short interconnection traces among the different terminal pads as in the prior art PGA packages. Consequently, the differences between the physical length of the present conductor runs are less than 50% of the conventional PGA packages. Therefore, the electrical signal delay between the different channels or conductors has been significantly reduced, but not completely eliminated. Moreover, since the distance between any two conductor runs (i.e., two runs 40a) extending in the same direction has been increased due to the alternating pattern, the cross-talk between such conductors are minimized.

The wiring board 14 further includes a rectangularly-shaped central portion 14a defining a die attachment area for receiving the die 18. The lower surface of the die 18 may be fixed to the die attachment area 14a of the wiring board by any type of adhesive material such as adhesive glue 15, as is shown in FIG. 1.

In order to further equalize the electrical signal delays between the different channels, there is envisioned in the present invention the employment of delay line (capacitance-loading) networks in the metalized trace pattern. In FIG. 4, there is shown a top view of one embodiment of a capacitive loading network formed of a plurality of first outwardly extending "open circuit" stub members 43a and second outwardly extending "open circuit" stub members 43b. The stub members 43a, 43b are made integral with the conductor run 40 and are disposed on opposite sides thereof. It should be apparent to those skilled in the art that either first or second outwardly extending stub members could be used alone. Further, any number of stub members could be utilized. The actual number of stub members would be dependent upon the tolerance required to be obtained in impedance matching between the different channels. As a result, the delay line (capacitance-loading) network permits an impedance matching capability and thus equalizes the signal delays between the different channels, thereby compensating for the effects of the terminal pins, the TAB tape lead circuit, and any discontinuities within the packaging structure.

Figure 5:
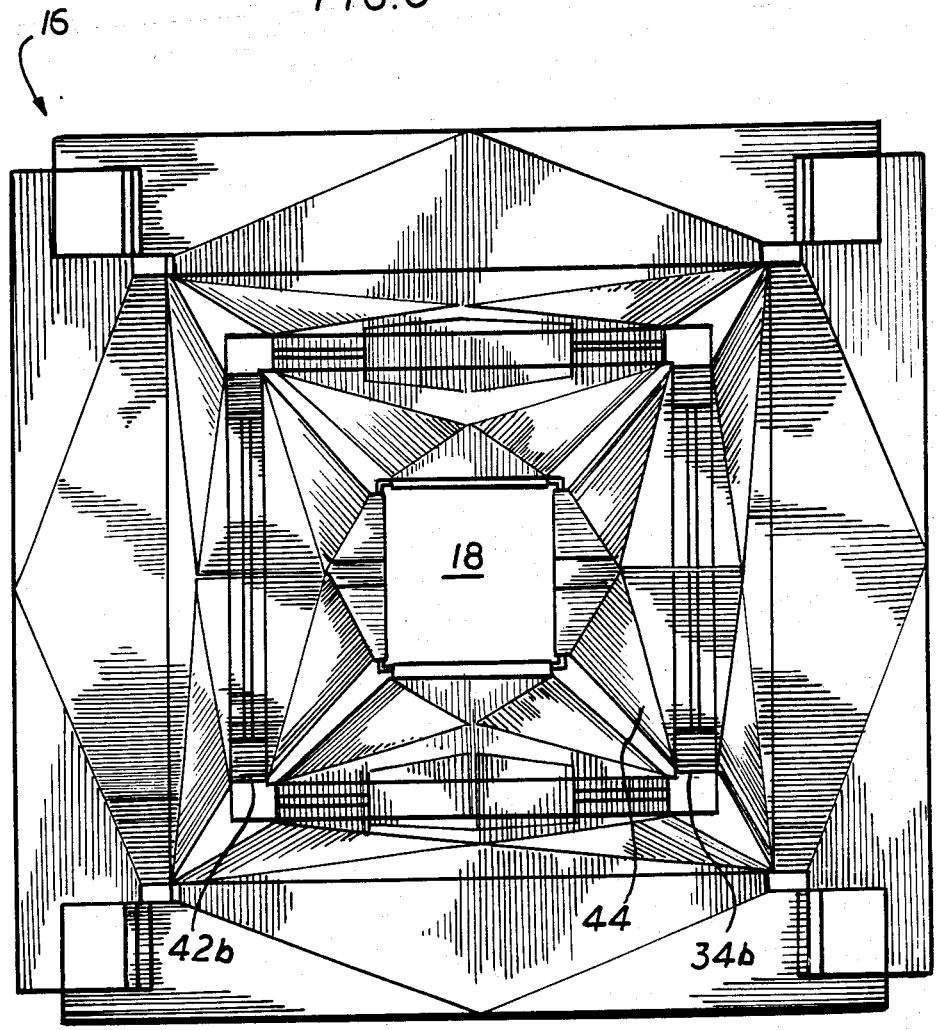
FIG. 5 is a top plan view of a TAB tape lead circuit.

The TAB tape lead circuit 16 includes inner conductors 44 for establishing electrical connection between bonding pads 42b formed on outer lead bond area 34b and the die 18, as is illustrated in FIG. 5. The semiconductor die or chip 18 has a top active surface having a plurality of conductive gold bumps, two of which, 46a and 46b, are illustrated in FIG. 1. The first or inner ends of the conductors 44 can be bonded by thermal compression bonding with a film epoxy adhesive to the conductive bumps 46a and 46b by a known tape automated bonding procedure. The second or outer ends of the conductors 44 are connected to the bonding pads 42b in the OLB area 34b. The bonding pads 42b on the tape circuit 16 are disposed to be in vertical alignment with the bonding pads 42a on the wiring board 14. Further, the bonding pads 42b can be directly bonded to the bonding pads 42a in the same tape automated bonding procedure.

The insulator material 20 may be formed of any thermal conducting material such as thermal grease which provides electrical isolation between the die 18 and the cover member 22. The cover member or lid 22 is of a generally rectangular structure conforming to the configuration of the package body member 12. The cover member includes a cavity 48 which is filled with the insulator material 20. The cover member 22 also includes four corner areas B similar to the areas A on the body member 12. These areas B may be effectively used to house a variety of discrete electrical components 52, such as resistors, capacitors, inductors and the like, which can be suitably connected to the wiring board 14. The cover member 22 may be preferably formed of a good thermal conducting material and has side flanges 54 which can be hermetically sealed or bonded to the wiring board 14 so as to prevent exposure to the atmospheric environment. Alternatively, the lid 22 may be made of a ceramic material such as aluminum nitrate or the like. The bonding of the cover member to the wiring board can be accomplished in any number of conventional means such as heat-bonding, ultrasonic welding, or adhesive bonding with an epoxy adhesive.

From the foregoing detailed description, it can thus be seen that the above described embodiment provides a pin grid array package structure which has a higher packaging density than the conventional PGA packages. The PGA structure of the present invention includes a substrate or wiring board in which very long and very short interconnection traces among the different terminal pads have been halved. This is accomplished by the provision of first conductor runs which extend outwardly from the bonding pads on the outer lead bond area and alternating second conductor runs which extend inwardly from the bonding pads on the outer bond area. Further, capacitive loading networks are formed in the conductor runs so as to equalize electrical signal delays between the conductor runs.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A pin grid array package structure comprising:
a package body member (12) being formed of a generally diamond-shaped configuration and having top and bottom surfaces;
a plurality of metal terminal pins (24) covering substantially the entire top and bottom surfaces of said body member (12), said terminal pins (24) extending from the bottom surface of said body member (12) and protruding slightly above the top surface thereof to form terminal pin ends (30);
a wiring board (14) being placed over said body member (12) for engagement with said terminal pin ends (30), said board having a metalized trace pattern deposited on its top surface and having a central portion for receiving a semiconductor chip (18);
said wiring board including a lead bond area (34a) of a rectangular shape which is disposed in a spaced apart surrounding relationship with the chip (18), said lead bond area (34a) being formed with bonding pads (42a);
a TAB tape lead circuit (16) disposed over said chip (18) and said wiring board (14) for establishing electrical connection between said bonding pads (34a) on said board (14) and said die (18);
said metalized trace pattern including a plurality of conductor runs (40) terminating at its ends with spaced apart metal terminal pads (36) which are in substantially vertical alignment with said respective terminal pin ends (30);
said plurality of conductor runs being formed of first conductor runs (40b) extending outwardly from the bonding pads (42a) on the lead bond area (34a) and alternating second conductor runs (40b) extending inwardly from the bonding pads (42a) on the lead bond area (34a); and
cover means for enclosing said body member (12), tape lead circuit (16), die (18), and board 914) to prevent exposure to atmospheric environment.

2. A pin grid array package structure as claimed in claim 1, wherein said cover means comprises a lid (22) having a cavity (48) filled with insulator material (20), said lid (22) being bonded to said wiring board (14).

3. A pin grid array package structure as claimed in claim 1, further comprising delay line network means being formed in said metalized trace pattern of wiring board for equalizing signal delays between different conductor runs.

4. A pin grid array package structure as claimed in claim 3, wherein said delay line network means comprises a plurality of first outwardly extending stub members (43a) formed integrally with said conductor runs (40).

5. A pin grid array package structure as claimed in claim 4, wherein said delay line network means further comprises a plurality of second outwardly extending stub members (43b) formed integrally with said conductor runs (40), said second outwardly extending stub members (43b) being disposed opposite said first outwardly extending stub members (43a).

6. A pin grid array package structure as claimed in claim 1, wherein said terminal pins (24) are arranged in rows and columns to form a matrix array which is rotated 45° with respect to said package body member (12).

7. A pin grid array package structure as claimed in claim 6, wherein said body member (12) is formed with four corner areas (A) for accommodating discrete capacitors.

8. A pin grid array package structure as claimed in claim 1, wherein said body member (12) is formed of a thermoplastic material in which said terminal pins (24) are molded therein.

9. A pin grid array package structure as claimed in claim 2, wherein said lid is formed of a thermal conducting material.

10. A pin grid array package structure comprising:
a package body member (12) being formed of a generally diamond-shaped configuration and having top and bottom surfaces;
a plurality of metal terminal pins (24) covering substantially the entire top and bottom surfaces of said body member (12), said terminal pins (24) extending from the bottom surface of said body member (12) and protruding slightly above the top surface thereof to form terminal pin ends (30);
a wiring board (14) being placed over said body member (12) for engagement with said terminal pin ends (30), said board having a metalized trace pattern deposited on its top surface and having a central portion for receiving a semiconductor ship (18);
said wiring board including a lead bond area (34a) of a rectangular shape which is disposed in a spaced apart surrounding relationship with the chip (18), said lead bond area (34a) being formed with bonding pads (42a);
a TAB tape lead circuit (16) disposed over said chip (18) and said wiring board (14) for establishing electrical connection between said bonding pads (34a) on said board (14) and said die (18);
said metalized trace pattern including a plurality of conductor runs (40) terminating at its ends with spaced apart metal terminal pads (36) which are in substantially vertical alignment with said respective terminal pin ends (30);
said plurality of conductor runs being formed of first conductor runs (40b) extending outwardly from the bonding pads (42a) on the lead bond area (34a) and alternating second conductor runs (40b) extending inwardly from the bonding pads (42a) on the lead bond area (34a);

cover means for enclosing said body member (12), tape lead circuit (16), die (18), and board (14), to prevent exposure to atmospheric environment;
said cover means including a lid (22) having a cavity (48) filled with insulator material (20), said lid (22) being bonded to said wiring board (14); and
delay line network means being formed in said metalized trace pattern on said wiring board for equalizing signal delays between different conductor runs.

11. A pin grid array package structure as claimed in claim 10, wherein said delay line network means comprises a plurality of first outwardly extending stub members (43a) formed integrally with said conductor runs (40).

12. A pin grid array package structure as claimed in claim 11, wherein said delay line network means further comprises a plurality of second outwardly extending stub members (43b) formed integrally with said conductor runs (40), said second outwardly extending stub members (43b) being disposed opposite said first outwardly extending stub members (43a).

13. A pin grid array package structure as claimed in claim 10, wherein said terminal pins (24) are arranged in rows and columns to form a matrix array which is rotated 45° with respect to said package body member (12).

14. A pin grid array package structure as claimed in claim 13, wherein said body member (12) is formed with four corner areas (A) for accommodating discrete capacitors.

15. A pin grid array package structure as claimed in claim 1, wherein said body member (12) is formed of a thermoplastic material in which said terminal pins (24) are molded therein.

16. A pin grid array package structure as claimed in claim 15, wherein said lid is formed of a thermal conducting material.

* * * * *